United States Patent
Park et al.

(10) Patent No.: US 7,372,308 B2
(45) Date of Patent: May 13, 2008

(54) HIGH-VOLTAGE GENERATION CIRCUITS AND NONVOLATILE SEMICONDUCTOR MEMORY DEVICE WITH IMPROVED HIGH-VOLTAGE EFFICIENCY AND METHODS OF OPERATING

(75) Inventors: Dae-Sik Park, Hwasung-si (KR); Jin-Yub Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/485,214

(22) Filed: Jul. 12, 2006

(65) Prior Publication Data
US 2007/0086264 A1 Apr. 19, 2007

(30) Foreign Application Priority Data
Oct. 18, 2005 (KR) .................... 10-2005-0097841

(51) Int. Cl.
*H03K 3/00* (2006.01)
(52) U.S. Cl. ...................... 327/108; 327/430

(58) Field of Classification Search ................ 327/108, 327/112, 430
See application file for complete search history.

(56) References Cited

U.S. PATENT DOCUMENTS

| | | | | | |
|---|---|---|---|---|---|
| 6,535,034 | B1 * | 3/2003 | Wong | .......................... | 327/108 |
| 6,628,149 | B2 * | 9/2003 | Ajit | ........................... | 327/108 |
| 7,239,186 | B2 * | 7/2007 | Yu et al. | .................... | 327/112 |
| 7,292,073 | B2 * | 11/2007 | Khan et al. | ................ | 327/108 |

FOREIGN PATENT DOCUMENTS

| JP | 11297090 | 10/1999 |
|---|---|---|
| JP | 2000331479 | 11/2000 |
| KR | 1020020060051 | 7/2002 |

* cited by examiner

*Primary Examiner*—Kenneth B. Wells
(74) *Attorney, Agent, or Firm*—Myers Bigel Sibley & Sajovec, P.A.

(57) ABSTRACT

A power-voltage driver circuit includes a first MOS transistor configured to turn a second MOS transistor off when a high-voltage generator provides a high voltage output. Related methods are also disclosed.

9 Claims, 5 Drawing Sheets

| Signal & node | HVCON | VDCON | GNCON | N160 | N122 | N124 | N126 |
|---|---|---|---|---|---|---|---|
| Logical state or voltage level | H | L | L | 15~20V | VDD+Vt | Vt | Vt |

FIG. 3

| Signal & node | HVCON | VDCON | GNCON | N160 | N122 | N124 | N126 |
|---|---|---|---|---|---|---|---|
| Logical state or voltage level | H | L | L | VDD | VDD | VDD | VSS |

FIG. 4

HIGH-VOLTAGE GENERATION CIRCUITS AND NONVOLATILE SEMICONDUCTOR MEMORY DEVICE WITH IMPROVED HIGH-VOLTAGE EFFICIENCY AND METHODS OF OPERATING

CROSS-REFERENCE TO RELATED APPLICATION

This U.S. non-provisional patent application claims priority under 35 U.S.C. § 119 of Korean Patent Application 2005-97841 filed on Oct. 18, 2005, the entire contents of which are hereby incorporated by reference.

FIELD OF THE INVENTION

The present invention relates to semiconductor devices in general, and more particularly, to nonvolatile semiconductor memory devices.

BACKGROUND

Some nonvolatile semiconductor memories use the mechanisms of Fowler-Nordheim (F-N) tunneling and hot-electron injection to store data. Practically, in order to erase/program data using the F-N tunneling and hot-electron injection effects, high voltages of 15V through 20V may be needed together with a power source voltage. In general, a semiconductor memory device operable under a low power source voltage can employ a high-voltage generation circuit to generate a power source voltage and a high voltage.

FIG. 1 shows a high-voltage generation circuit of a semiconductor memory device according to the conventional art. The high-voltage generation circuit shown in FIG. 1 includes a high-voltage generator 10, a power-voltage driver 20, and a ground-voltage driver 40. The high-voltage generation circuit drives an output signal VOUT to a high voltage that is greater than a power source voltage VDD in response to a high-voltage control signal HVCON. The power-voltage driver 20 drives the output signal VOUT to the power source voltage VDD in response to a ground-voltage control signal GNCON.

As shown in FIG. 1, the power-voltage driver 20 includes depletion NMOS and PMOS transistors, 21 and 23, connected between an output node N60 and the power source voltage VDD. The NMOS transistor 21 is gated by the power-voltage control signal VDCON while the PMOS transistor 23 is gated by an inverse signal nVDCON of the power-voltage control signal VDCON.

However, in the conventional high-voltage generation circuit, charges accumulated at the output node N60 may leak toward the power source voltage VDD when the output signal VOUT is driven to a high voltage. In more detail, when the output signal VOUT is being driven to a high voltage, the power-voltage control signal VDCON goes to a logical "L" level (i.e., the level of the ground voltage VSS) and the inverse power-voltage control signal nVDCON goes to a logical "H" level (i.e., the level of the power source voltage VDD). In response, a voltage level at a common junction N22 shared by the two depletion NMOS transistors 21 and 25 is set to the level of VDD+Vt, while a voltage level at a common junction N24 shared by the NMOS and PMOS transistors 21 and 23 is set to the level of Vt. Here, Vt denotes a threshold voltage of the depletion NMOS transistor 21 or 25.

When the power source voltage VDD is pulled down to a lower voltage, the PMOS transistor 23 may turn on in response to the reduced VDD. As a result, when the output signal VDOUT is being driven to a high voltage, the high voltage generation efficiency may be degraded because charges accumulated at the output node N60 may leak into the power-voltage driver 20.

SUMMARY

Embodiments according to the invention can provide high-voltage generation circuits and nonvolatile semiconductor memory device with improved high-voltage efficiency and methods of operating such circuits and devices. Pursuant to these embodiments, a power-voltage driver circuit includes a first MOS transistor configured to turn a second MOS transistor off when a high-voltage generator provides a high voltage output.

In some embodiments according to the invention, the first MOS transistor includes a first junction that is electrically connected to a bulk of the first MOS transistor. In some embodiments according to the invention, the second MOS transistor includes a second junction that is electrically connected to a bulk of the second MOS transistor.

In some embodiments according to the invention, the first MOS transistor includes a channel having a first junction, and the circuit further includes a second junction of the second MOS transistor that is electrically connected to the first junction, wherein the second MOS transistor is coupled to a gate electrode of the first MOS transistor. In some embodiments according to the invention, the circuit further includes a third MOS transistor electrically coupled between the gate electrode of the first MOS transistor and a reference voltage level.

In some embodiments according to the invention, a high-voltage generation circuit includes an output node providing an output signal. A high-voltage generator drives the output signal into a high voltage over a power source voltage and a power-voltage driver settles the output signal on the power source voltage. The power-voltage driver includes a first MOS transistor with a first channel of depletion type, having a junction connected to the output node and a second MOS transistor with a second channel having a junction connected to the other junction of the first MOS transistor, being gated by a voltage level of the junction of the second MOS transistor in order to be turned off.

In some embodiments according to the invention, a bulk of the second MOS transistor is electrically connected to the junction of the second MOS transistor. In some embodiments according to the invention, the power-voltage driver further includes a third MOS transistor of the second channel being driven to provide a voltage level of the junction of the second MOS transistor to a gate electrode of the second MOS transistor, making the second MOS transistor turned off.

In some embodiments according to the invention, a bulk of the third MOS transistor is electrically connected to the junction of the second MOS transistor. In some embodiments according to the invention, the first channel is an N-channel and the second channel is a P-channel, wherein the power-voltage driver further includes a fourth MOS transistor of the first channel being driven to provide a ground voltage to a gate electrode of the second MOS transistor, making the second MOS transistor turned on.

In some embodiments according to the invention, the second through fourth MOS transistors are gated in response to a power-voltage control signal. In some embodiments according to the invention, the power-voltage driver further comprises a fifth MOS transistor of the first channel with a depletion type connected between the output node and the junction of the first MOS transistor, being gated by the power source voltage.

In some embodiments according to the invention, the high-voltage generator further includes a ground-voltage driver settling the output signal on a ground voltage. In some embodiments according to the invention, the high-voltage generation circuit is included in a nonvolatile semiconductor memory device that includes a memory cell array including pluralities of memory cells electrically erasable and programmable by a high voltage generated internally and a high-voltage generation circuit generating a high voltage over a power source voltage supplied from an external source.

In some embodiments according to the invention, a method of providing a high voltage for erase/programming functions in a nonvolatile semiconductor memory device includes using a first MOS transistor to turn off a second MOS transistor off when a high-voltage generator provides a high voltage output from a high-voltage generation circuit.

BRIEF DESCRIPTION OF THE DRAWINGS

FIG. 3 is a table illustrating logical states and voltage levels of signals and nodes in a power-voltage driver while driving an output signal to a high voltage level provided by the high-voltage generation circuit in some embodiments according to the present invention.

FIG. 4 is a table illustrating logical states and voltage levels of signals and nodes in a power-voltage driver while driving an output signal with a power source voltage in the high-voltage generation circuit according to the present invention.

DESCRIPTION OF EMBODIMENTS ACCORDING TO THE INVENTION

Figure 1:
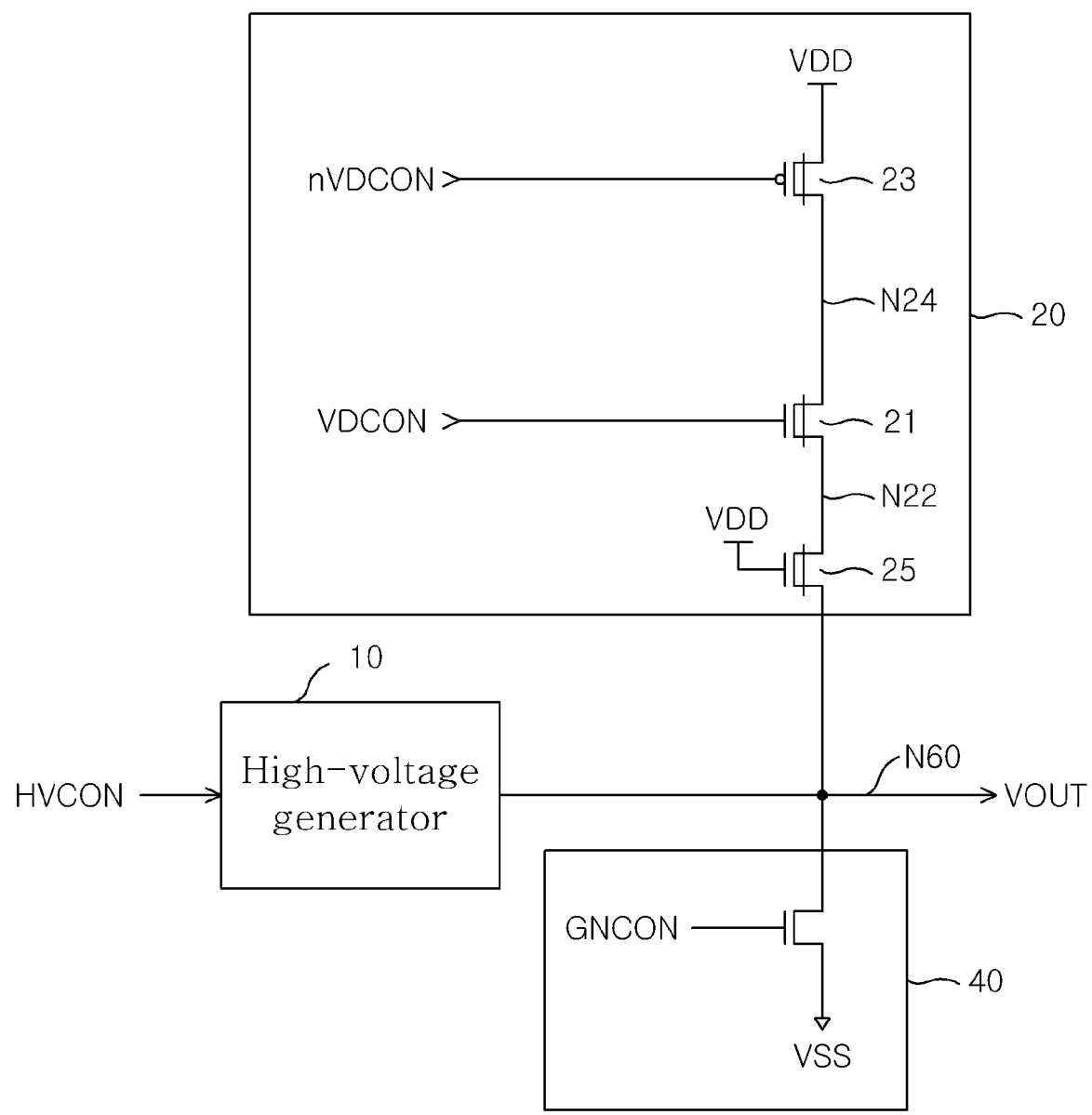
FIG. 1 is a schematic diagram showing a high-voltage generation circuit of a semiconductor memory device according to the prior art.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. Thus, a first element could be termed a second element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that while in some embodiments the first channel is described as being an N-channel and the second channel is described as being a P-channel, the first and second channels may be implemented with the P and N-channels being reversed. It will further be understood that, although this disclosure describes high-voltage generation circuit according to the present invention as being applicable to nonvolatile semiconductor memory devices, the invention may be practiced in other areas. For example, a high-voltage generation circuit according to the present invention may be incorporated in other kinds of semiconductor memory devices using signals with high voltage levels that exceed a power source voltage supplied from an external source.

Figure 2:
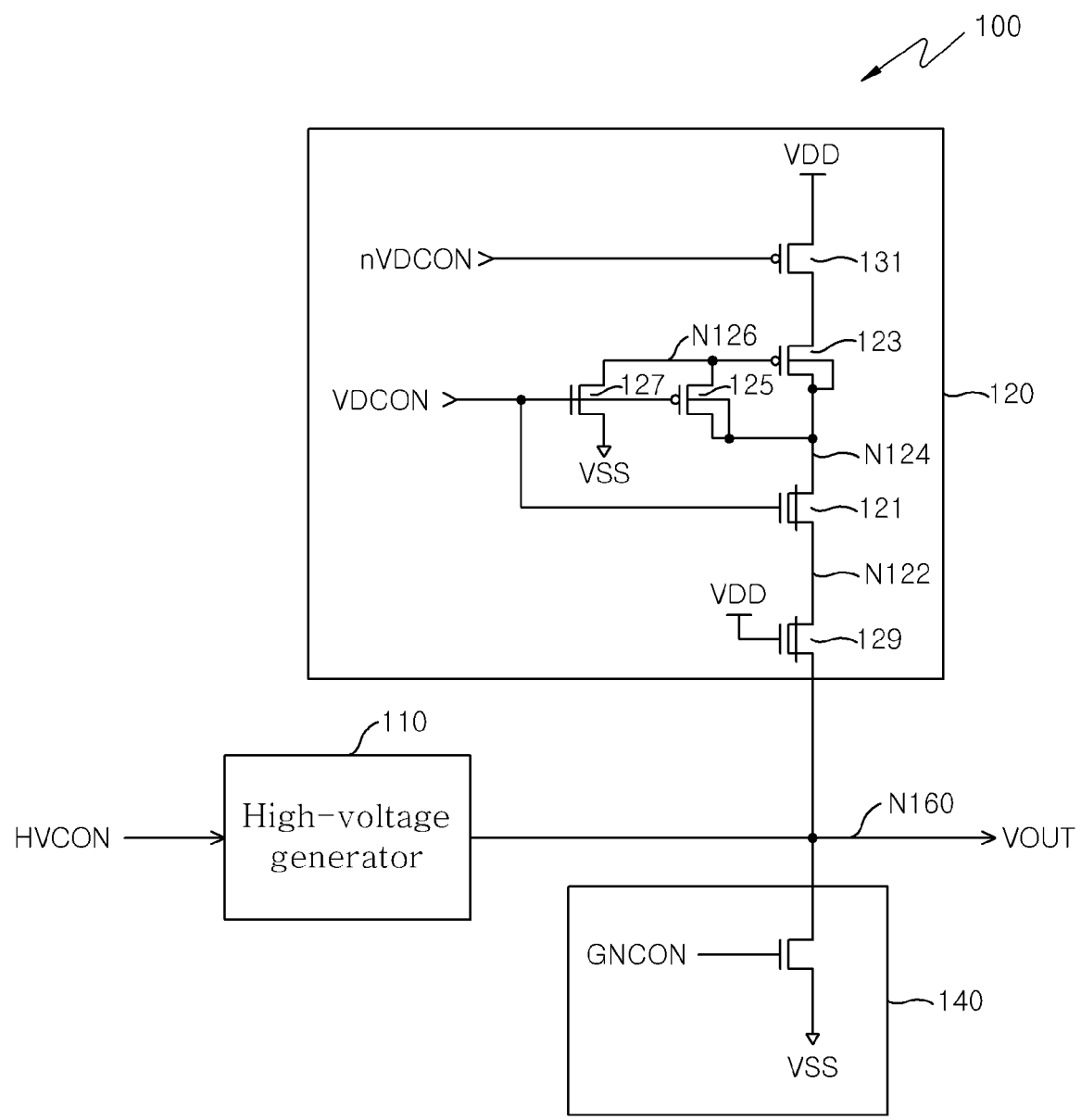
FIG. 2 is a schematic diagram illustrating a high-voltage generation circuit 100 in accordance with some embodiments of the present invention.

FIG. 2 is a schematic diagram illustrating a high-voltage generation circuit 100 in accordance with some embodiments of the present invention. Referring to FIG. 2, the high-voltage generation circuit 100 includes a high-voltage generator 110, a power-voltage driver 120, and a ground-voltage driver 140.

The high-voltage generation circuit 100 generates an output signal VOUT at an output node N160. The high-voltage generator 110 drives the output signal VOUT to a high voltage in response to a high-voltage control signal HVCON. Here, the high voltage generated by the high-voltage generator 110 is greater than a power source voltage VDD that is supplied from an external source. As an example, in some embodiments according to the invention, when the power source voltage VDD is about 1.5V, the high voltage can be in the voltage range of about 15V through 20V.

The power-voltage driver 120 drives the output signal VOUT to the power source voltage VDD in response to a power-voltage control signal VDCON. If the power-voltage control signal VDCON is at a logical "H" level, the output signal VOUT is regulated to the level of the power source voltage VDD. And, when the output signal VOUT is at the level of the high voltage, the power-voltage control signal VDCON is at a logical "L" level to interrupt a current path to/from the power source voltage VDD.

As shown in FIG. 2, the power-voltage driver 120 includes first and second MOS transistors 121 and 123. The first MOS transistor 121 has a junction N122 connected to the output node N160. The first MOS transistor 121 is an N-channel depletion MOS transistor. As such, if the first MOS transistor 121 is implemented with the N-channel depletion transistor, it may be possible to reduce the likelihood of a drop in the high voltage output due to the operation of the first MOS transistor 121. In this description, the N-channel may be referred to as "first channel".

Still referring to FIG. 2, a junction of the second MOS transistor 123 is connected to the other junction of the first MOS transistor 121. The other junction of the second MOS transistor 123 is connected to the power source voltage VDD. The second MOS transistor 123 is implemented with a P-channel MOS transistor. In this specification, the P-channel may be referred to as "second channel".

The second MOS transistor 123 is gated with a voltage level of the junction thereof to provide a turn-off operation. In this case, a voltage at the gate electrode of the second MOS transistor 123 can be about 0.0V relative to the source terminal of the second MOS transistor 123. Thus, even though the level of the power source voltage VDD may be reduced, the second MOS transistor 123 may remain off to interrupt the current path which may otherwise affect the high voltage output.

In some embodiments according to the invention, the bulk of the second MOS transistor 123 is electrically connected to the junction N124 of the second MOS transistor 123. With this interconnection, it may be possible to prevent a forward bias between the junction and bulk of the second MOS transistor 123 of P-channel, thereby lessening the generation of leakage current therein.

In some embodiments according to the invention, the power-voltage driver 120 includes a third MOS transistor 125 configured to provide a voltage level of the junction 124 to the gate of the second NMOS transistor 123 in response to a logical "L" level of VDCON.

In some embodiments according to the invention, the bulk of the third MOS transistor 125 is electrically connected to the junction N124 of the second MOS transistor 123, together with its own source terminal. This interconnection may prevent a forward bias between the junction and bulk of the third MOS transistor 125, thereby allowing a reduction in leakage current.

As further shown in FIG. 2, the power-voltage driver 120 can include a fourth N-channel MOS transistor 127 connected to the gate of the second MOS transistor 123. In operation, the fourth N-channel MOS transistor 127 can provide the ground voltage VSS to the gate of the second MOS transistor 123 for turn-on operation. In particular, the fourth MOS transistor 127 transfers the ground voltage VSS to the gate electrode of the second MOS transistor 123 in response to a logical "H" level of the power-voltage control signal VDCON to turn the second MOS transistor 123 on.

In some embodiments according to the invention, the power-voltage driver 120 also includes a fifth MOS transistor 129 of N-channel depletion type. The fifth MOS transistor 129 is electrically connected between the output node N160 and the junction N122 of the first MOS transistor 121, having the power source voltage VDD provided to the gate thereof. As appreciated by the present inventors, without the fifth MOS transistor 129, the power-voltage driver 120 may develop a large voltage difference between the gate electrode and junction N122 of the first MOS transistor 121 when the power-voltage control signal VDCON is a logical "L" level. As a result, the fifth MOS transistor 129 may allow reduced voltage drop between the gate electrode and junction N122 of the first MOS transistor 121.

As further shown in FIG. 2, the power-voltage driver 120 can include a sixth MOS transistor 131 electrically connected between the power source voltage VDD and the second MOS transistor 123, having the inverse power-voltage control signal nVDCON provided to the gate electrode thereof. The ground-voltage driver 140 is configured to drive the output signal VOUT to the ground voltage level VSS in response to the ground-voltage control signal GNCON being a logical "H" level.

FIG. 3 is a table that illustrates the logical states and voltage levels of signals in the power-voltage driver 120 while driving the output signal VOUT in operations of embodiments according to the present invention. According to FIG. 3, when the output node N160 (VOUT) increases to a voltage of about 15~20V, the junction of the first MOS transistor 121 (N122) is at the level of VDD+Vt (threshold voltage) and the junction of the second MOS transistor 123 (N124) is at the level of Vt. In this state, the gate electrode of the second MOS transistor 123 is at the level of Vt. Thus, a reduction in leakage current through the second MOS transistor 123 may be provided.

Referring to FIG. 4, when the output signal VOUT is being driven to the power source voltage VDD by the power-voltage generator 120, the logical states of the high-voltage control signal HVCON, the power-voltage control signal VDCON, and the ground-voltage control signal GNCON are logical "L", "H", and "L" levels, respectively. According to FIG. 4, the gate electrode N126 of the second MOS transistor 123 is set to the ground voltage VSS (by VDCON=H), which drives the junctions N122 and N124 to the level of the power source voltage VDD. As a result, the output node N160 is driven to the power source voltage VDD.

Figure 5:
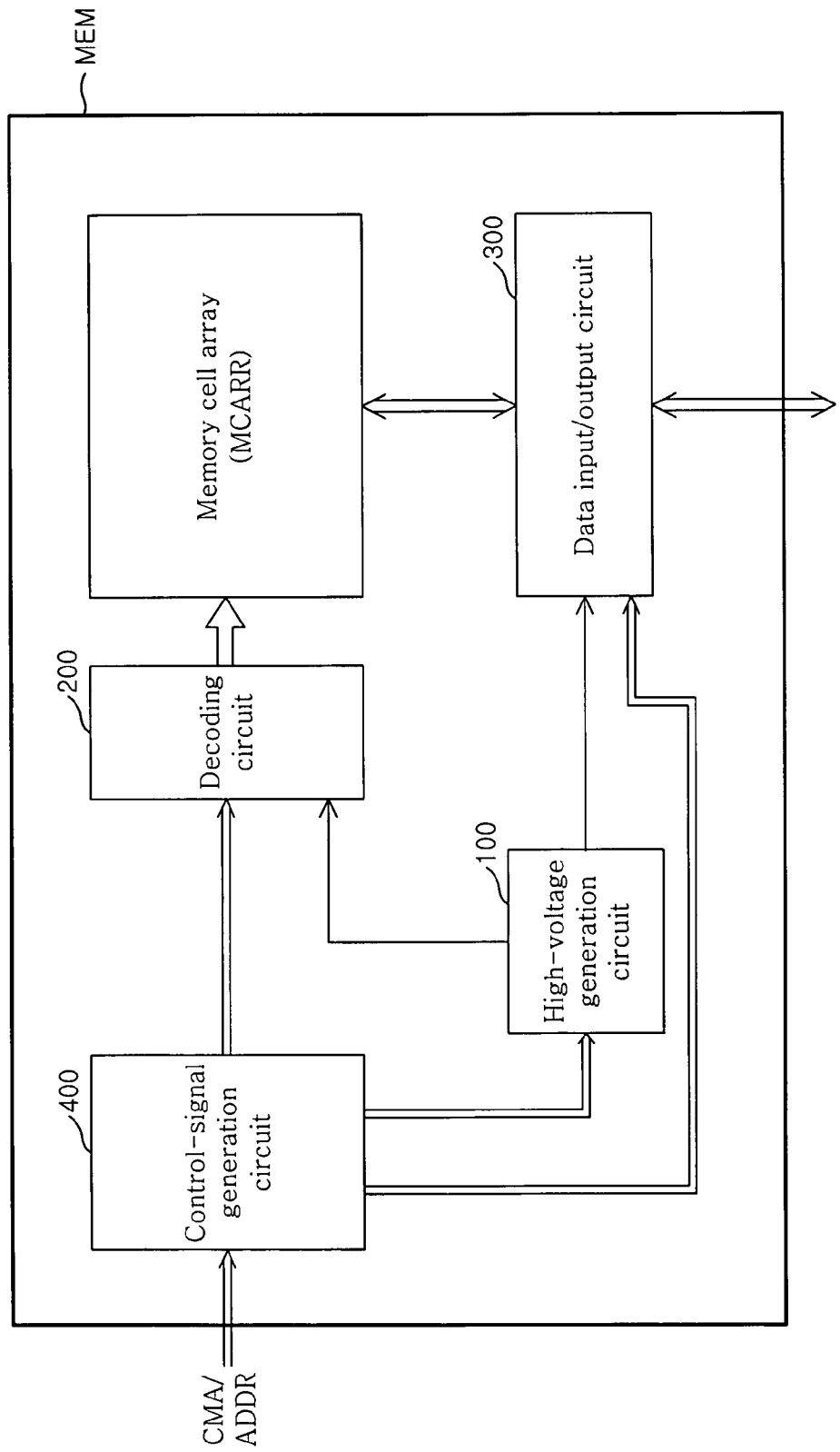
FIG. 5 is a block diagram illustrating a nonvolatile semiconductor memory device in some embodiments according to the present invention.

FIG. 5 is a block diagram illustrating a nonvolatile semiconductor memory device in accordance with an embodiment of the present invention. Referring to FIG. 5, the nonvolatile semiconductor memory device MEM of the invention includes a memory cell array MCARR, the high-voltage generation circuit 100, a data input/output circuit 300, a control-signal generation circuit 400, and a decoding circuit 200.

The memory cell array MCARR includes pluralities of memory cells (not shown) that are electrically programmable and erasable by a high voltage generated by the high-voltage generation circuit 100. The high-voltage generation circuit 100 may be implemented as described herein to generate a high voltage which exceeds the power source voltage VDD supplied from an external source.

The decoding circuit 200 selects a memory cell of the memory cell array MCARR, being driven to provide the high voltage to the selected memory cell from the high-voltage generation circuit 100. The data input/output circuit 300 inputs data to be stored in the memory cell array MCARR and outputs data read from the memory cell array MCARR. Here, the data input/output circuit 300 may be associated with the high voltage supplied from the high-voltage generation circuit 100.

The control-signal generation circuit 400 shown in FIG. 5 receives commands CMD and address signals ADDR provided from an external system and generates signals to control the high-voltage generation circuit 100, the decoding circuit 200, and the data input/output circuit 300.

As described herein, in some embodiments according to the invention, the power-voltage driver of the high-voltage generation circuit includes the first MOS transistor of N-channel depletion and the second NMOS transistor of P-channel. The second MOS transistor is gated by a voltage level of its junction to assist the high-voltage generation circuit to remain off when the high-voltage generator operates to provide a high voltage output. With the high-voltage generation circuit and the nonvolatile semiconductor memory device including the same, the current path between the output node and the power source voltage may be interrupted while the high voltage is generated, thereby allowing possible improvement in efficiency of the high-voltage generation. In some embodiments according to the invention, if the bulk of the second MOS transistor is electrically connected to the junction thereof, the generation of the leakage current may be further reduced to allow further improvement in efficiency.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A high-voltage generation circuit comprising:
   an output node providing an output signal;
   a high-voltage generator driving the output signal into a high voltage over a power source voltage; and
   a power-voltage driver settling the output signal on the power source voltage,
   wherein the power-voltage driver comprises:
   a first MOS transistor with a first conductivity type channel of depletion type, having a junction connected to the output node; and
   a second MOS transistor with a second conductivity type channel having a junction connected to the other junction of the first MOS transistor, being gated by a voltage level of the junction of the second MOS transistor in order to be turned off.

2. The high-voltage generation circuit as set forth in claim 1, wherein a bulk of the second MOS transistor is electrically connected to the junction of the second MOS transistor.

3. The high-voltage generation circuit as set forth in claim 1, wherein the power-voltage driver further comprises a third MOS transistor of the second channel being driven to provide a voltage level of the junction of the second MOS transistor to a gate electrode of the second MOS transistor, making the second MOS transistor turned off.

4. The high-voltage generation circuit as set forth in claim 3, wherein a bulk of the third MOS transistor is electrically connected to the junction of the second MOS transistor.

5. The high-voltage generation circuit as set forth in claim 3, wherein the first channel is an N-channel and the second channel is a P-channel,
   wherein the power-voltage driver further comprises a fourth MOS transistor of the first channel being driven to provide a ground voltage to a gate electrode of the second MOS transistor, making the second MOS transistor turn on.

6. The high-voltage generation circuit as set forth in claim 5, wherein the second through fourth MOS transistors are gated in response to a power-voltage control signal.

7. The high-voltage generation circuit as set forth in claim 5, wherein the power-voltage driver further comprises a fifth MOS transistor of the first channel with a depletion type connected between the output node and the junction of the first MOS transistor, being gated by the power source voltage.

8. The high-voltage generation circuit as set forth in claim 1, wherein the high-voltage generator further comprises a ground-voltage driver settling the output signal on a ground voltage.

9. The high-voltage generation circuit as set forth in claim 1 included in a nonvolatile semiconductor memory device comprising:
   a memory cell array including pluralities of memory cells electrically erasable and programmable by a high voltage generated internally; and
   a high-voltage generation circuit generating a high voltage over a power source voltage supplied from an external source.

* * * * *